(12) United States Patent
Staines

(10) Patent No.: US 7,215,083 B2
(45) Date of Patent: May 8, 2007

(54) MICROWAVE GENERATOR

(75) Inventor: Geoffrey Staines, Röthenbach (DE)

(73) Assignee: Diehl BGT Defence GmbH & Co., KG, Überlingen (DE)

( * ) Notice: Subject to any disclaimer, the term of this patent is extended or adjusted under 35 U.S.C. 154(b) by 0 days.

(21) Appl. No.: 11/320,238

(22) Filed: Dec. 28, 2005

(65) Prior Publication Data
US 2006/0158122 A1    Jul. 20, 2006

(30) Foreign Application Priority Data
Jan. 18, 2005    (DE)  ..................... 10 2005 002 279

(51) Int. Cl.
*H01T 13/00*    (2006.01)
*H01J 19/80*    (2006.01)

(52) U.S. Cl. ................... 315/39; 315/39; 333/20; 333/222

(58) Field of Classification Search ............... 315/39; 333/20, 222; 361/128
See application file for complete search history.

(56) References Cited

U.S. PATENT DOCUMENTS 6,822,394 B2 * 11/2004 Staines et al. .............. 315/39
2004/0190214 A1 * 9/2004 Dommer et al. ........... 361/128

FOREIGN PATENT DOCUMENTS

DE      27 66 24 C    10/1913

* cited by examiner

*Primary Examiner*—Tho Phan
*Assistant Examiner*—Chuc Tran
(74) *Attorney, Agent, or Firm*—Scully, Scott, Murphy & Presser, P.C.

(57) ABSTRACT

Microwave generator having two electrodes which are provided in a housing and are separated via a spark gap which breaks down when a high voltage is applied in order to emit microwaves, in which the first electrode (6) is in the form of a pot, and the other, inner electrode (5) engages over the first electrode on the outside at a distance therefrom at least over a part of the length thereof with the pot-shaped electrode (6) having a bottom section (10) which concurrently forms the side termination of the housing.

5 Claims, 1 Drawing Sheet

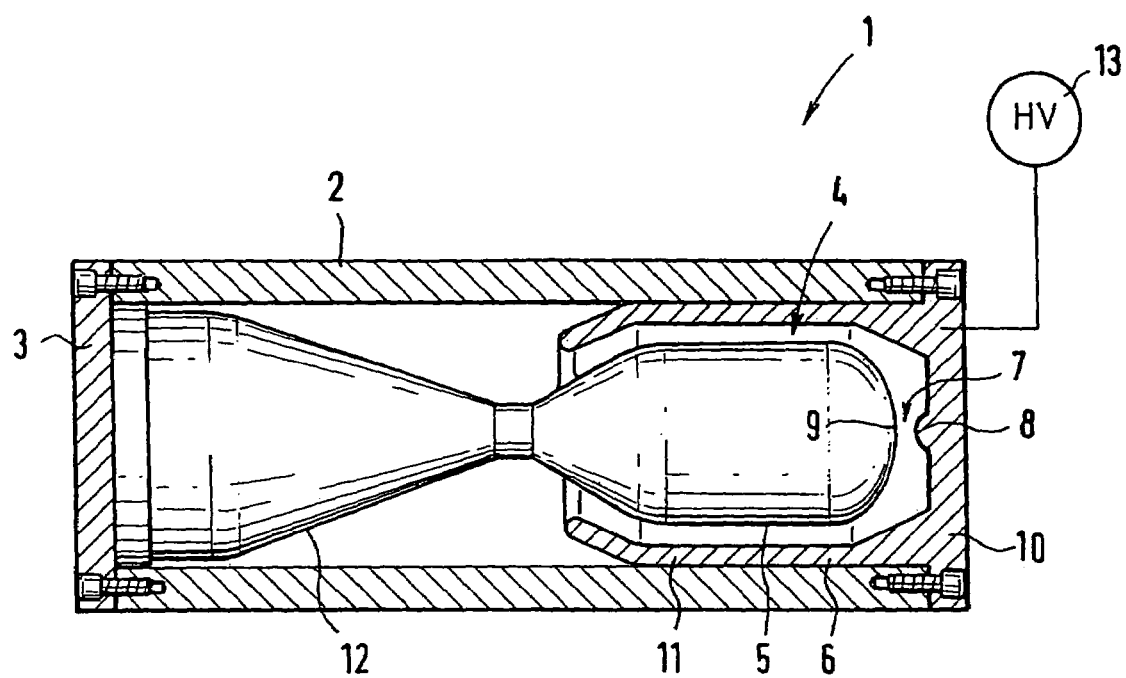

MICROWAVE GENERATOR

BACKGROUND OF THE INVENTION

1. Field of the Invention

The invention relates to a microwave generator having two electrodes which are provided in a housing and are separated via a spark gap which breaks down when a high voltage is applied in order to emit microwaves.

The operation of a microwave generator such as this is based on the idea that a high-voltage source, for example a capacitor bank which is charged in parallel on the basis of the principle of the Marx impulse voltage circuit and is then connected in series, is short-circuited via a spark gap and is thus discharged. The short-circuit results in highly oscillating discharge or short-circuit currents with a steep flank, which contain a mixture of very high frequencies which are in general emitted via an antenna as microwave energy with a broadband spectrum that is dependent on the frequency mixture. This broadband microwave spectrum has such a high energy density that the radio traffic in the vicinity of a microwave generator such as this is at least adversely affected, and the input circuits of electronic circuits can be disturbed or even destroyed by resonance effects. As an alternative to the use of a Marx impulse voltage circuit, it is also possible to use a high-voltage generator that is operated by explosives and which, in comparison to conventional high-voltage generators, can provide a single high-voltage pulse with extremely high pulse energy.

The emission of the microwaves is based on a discharge-dependent resonance effect. The initiating electrodes between which the spark gap is formed have further associated resonating electrode or conductor structures in which the discharge current pulse which is produced on breakdown leads to powerful sudden oscillations whose frequency mixture is a resonant peak depending on the instantaneous electrically effective geometry of the resonator and/or the resonator structure.

2. Discussion of the Prior Art

A microwave generator of the type mentioned initially is known from DE 101 51 565 A1. This generator comprises a spark gap which is formed between a small electrode in the shape of a mushroom head, and a larger, club-like electrode. Furthermore, an outer conductor is provided, which surrounds the club-shaped electrode and is connected via an appropriate connecting structure to the electrode which is in the form of a mushroom head. This connecting structure can be shifted together with the electrode which is in the form of a mushroom head via a spindle mechanism in its axial position with respect to the stationary second electrode and the stationary conductor surrounding it, for tuning purposes. The housing of this generator is closed in the area in which the electrode spindle is passed out by means of a large-area, plug-like isolating closure cover, on which the hollow-cylindrical conductor is also arranged, and extends from this housing end to the resonator electrode, which engages, at a distance from it, at the side.

This generator configuration is very complex and requires a large number of separate components, particularly in the area of the housing closure for the high-voltage supply, which is applied to the electrode spindle, where a specially designed closure cover composed of an adequate dielectric material must be provided, and on which the hollow-cylindrical conductor can also be mounted as described, in addition to the guide spindle.

SUMMARY OF THE INVENTION

The invention is thus based on the problem of specifying a microwave generator of simpler design and whose production requires fewer parts.

In order to solve this problem in the case of a microwave generator of the type mentioned initially, the invention provides that the first electrode is in the form of a pot, and the other, inner electrode engages over it on the outside, at a distance from it, at least over a part of its length, with the pot-like electrode having a bottom section which at the same time forms the side termination of the housing.

In the microwave generator according to the invention, the first initiating electrode is itself in the form of a relatively large-area conductor structure, which is essentially in the form of a pot. It has a bottom section via which the high-voltage is supplied. There are advantageously no complex contacts, as in the case of the axial high-voltage contacts in DE 101 51 565 A1.

An axially extending section, which engages over the inner electrode, which is preferably in the form of a club and is at a distance from it, emerges at the edge from the closed bottom section of this metallic electrode which, in order to form the spark gap, has a suitable tab or the like which is opposite the inner electrode and at a distance from it. This section may be designed to be closed, that is to say the pot-like electrode forms a rotationally symmetrical, hollow-cylindrical component, or alternatively this section can also be formed using a plurality of parallel-running rods or sections, which form a type of cage.

A microwave generator can be produced in a simple manner using an electrode designed in this way. This is because the electrode carries out a plurality of functions, as an integral, individual component. On the one hand, that of formation of the spark gap, while on the other hand it offers the capability to supply high voltage and, finally, its bottom section at the same time forms the closure plate of the housing, so that there is no longer any need to provide any separate isolating plates or the like in this area. The overall design of the generator is thus simplified.

In a development of the invention, it is possible to provide that the internal shape of the pot-like electrode corresponds essentially to the external shape of the inner electrode at least over a part of the length over which it engages over the inner electrode. This means that the shape of the mutually opposite surfaces of the inner and outer electrode and/or of the electrode section are matched to one another in order to optimize the resultant coaxial conductor structure, with respect to the high charging voltages. In this case, the distance between the inner and the outer electrode may be approximately equal, at least over a part of the length over which they engage over one another radially. In particular, the ratio of the internal diameter of the outer electrode to the external diameter of the inner electrode is approximately constant, at least over a part of the length over which they engage over one another radially. This means that the impedance of the electrode or conductor structure in the radial area in which they engage over one another is approximately the same everywhere, and that there are no sudden impedance changes in this area, which would lead to reflections of the discharge or short-circuit currents, which oscillate in the case of a discharge.

As described, in particular for manufacturing reasons, both electrodes are rotationally symmetrical, with the inner electrode preferably being in the form of a club, and the outer electrode preferably being hollow cylindrical.

BRIEF DESCRIPTION OF THE DRAWING

Further advantages, features and details of the invention will come evident from the exemplary embodiment described in the following text and from the single FIGURE of the drawing.

DETAILED DESCRIPTION OF THE INVENTION

The FIGURE shows a microwave generator 1 according to the invention in the form of an outline illustration. This comprises a cylindrical insulating housing 2, preferably a glass-fibre housing, which is closed on one side via a closure cover 3, composed of an insulating material, by way of example. A resonator 4 is formed in the interior, comprising two mutually opposite electrodes 5, 6, with the electrode 5 essentially being in the form of a club with a central cylindrical section of constant diameter and forming the inner electrode, while the electrode 6 is in the form of a pot and forms the outer electrode. Both are rotationally symmetrical components.

The two components 5, 6 are separated from one another via a spark gap 7 which is formed by means of two initiating electrodes 8, 9. The initiating electrode 8 is in the form of a projecting tab on the outer electrode 6, while the initiating electrode 9 is in the form of an integral surface on the spherical cap of the inner electrode 5.

A preferably gaseous dielectric, in particular $SF_6$ at high pressure, is held at high pressure in the interior of the housing.

As the FIGURE shows, the outer electrode 6 has a pot-like shape. It comprises a bottom section 10 on which a hollow-cylindrical electrode section 11 is provided, projecting axially and, as is shown in the FIGURE, engages over the club-like resonator or the electrode 5 on which an antenna 12 is arranged as an emitting element in the form of a funnel-like structure. In the central area, where it engages over the cylindrical central section of the electrode 5, the electrode section 11 likewise has a constant internal diameter.

As can be seen, the bottom section 10 of the electrode 6 at the same time forms the side closure plate for the housing 2, via which the housing interior which, as described, is filled with the gaseous dielectric (a liquid dielectric such as oil can also be used as an alternative), is tightly sealed. The integral electrode 6, which is preferably in the form of a metallic rotating part, thus has a further function in addition to its actual electrode function.

As the FIGURE shows, the internal shape of the electrode 6 is designed to correspond to the external contour of the inner electrode, particularly in the central cylindrical area of the electrode section 11, which is radially at a distance from the central cylindrical area of the inner electrode 5. The distance between the electrode section 11 and the inner electrode is preferably constant, at least in this area, in which the two of them are opposite one another, with their axes parallel. In general, except for the area in which the bottom section 10 is opposite the spherical cap and the opposite area where the diameters of the two electrodes 5, 6 taper, in the longitudinal sections in which the two electrodes engage over one another, the ratio of the internal diameter of the central area of the electrode section 11 to the external diameter of the central area of the inner electrode 5 should be essentially constant, in order to also provide a constant impedance response over the length of the mutually opposite sections as well. As the FIGURE shows, the electrode 5 tapers in the transitional area to the antenna 12, that is to say the diameter decreases. In a corresponding manner, the diameter of the outer electrode 6 also decreases in the end area, but not to such a great extent as that to which the diameter of the inner electrode 5 is reduced. This non-uniform diameter change allows deliberate impedance matching. A deliberate sudden impedance change is provided here, on which a part of the oscillating current is reflected. The shape and the duration of the emitted microwave pulses can be appropriately adapted by means of the specific, geometry-dependent impedance form or impedance profile.

As described, the bottom section 10 at the same time forms the housing closure. This allows contact to be made easily with the high-voltage source 13, for example a Marx impulse voltage generator. The use of an integral, metallic electrode of the described shape also offers the capability to avoid the problems associated with the use of separate isolator elements in the area of the high-voltage supply. These isolators often do not withstand the extreme load, such as the extremely high field strengths which act on the isolator in the event of a breakdown, typically in the order of magnitude of 100–500 GV/m, so that this results in malfunctions in the isolator area, or else an appropriate design of the isolator elements is necessary. The knowledge that no isolator whatsoever need be used in this area advantageously allows the problems resulting from the use of isolating material to be overcome, in addition to having a simple design.

During operation, the high voltage is applied to the bottom section 10 and thus to the electrode 6, that is to say the capacitor structure produced from the electrodes 5, 6 is charged up. On reaching the breakdown voltage, the spark gap 7 is triggered, thus resulting in the discharge or short-circuit currents as already described initially, resulting in oscillations at the electrode 5.

What is claimed is:

1. Microwave generator having two electrodes which are provided in a housing and are separated via a spark gap which breaks down when a high voltage is applied in order to emit microwaves, wherein a first said electrode (6) is in the form of a pot, and the other electrode being an inner electrode (5) engages over the first electrode on the outside thereof and at a distance therefrom over at least a part of the length of the first electrode with the pot-shaped electrode (6) having a bottom section (10) concurrently forming a side termination of the housing.

2. Microwave generator according to claim 1, wherein the internal shape of the pot-shaped electrode (6) corresponds essentially to the external shape of the inner electrode (5) over at least a part of the length thereof which engages over the inner electrode (5).

3. Microwave generator according to claim 1, wherein the distance between the inner and the outer electrode (5, 6) is approximately equal over at least a part of the length at which they engage radially over each other.

4. Microwave generator according to claim 1, wherein the ratio of the internal diameter of the outer electrode (6) relative to the external diameter of the inner electrode (5) is approximately constant over at least a part of the length at which they engage radially over each other.

5. Microwave generator according to claim 1, wherein said two electrodes (5,6) are rotationally symmetrical, the inner electrode (6) being in the form of a club and the outer electrode (6) being of a hollow cylindrical configuration.

* * * * *